US010178911B2

(12) United States Patent
Hewitt et al.

(10) Patent No.: US 10,178,911 B2
(45) Date of Patent: Jan. 15, 2019

(54) SAFETY APPARATUS FOR ELECTRICAL EQUIPMENT RACK

(71) Applicant: International Business Machines Corporation, Armonk, NY (US)

(72) Inventors: James Hewitt, Eastleigh (GB); Colin I. Holyoake, Braishfield (GB); Richard Postlethwaite, Salisbury (GB); Caroline J. Thomas, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 14/730,439

(22) Filed: Jun. 4, 2015

(65) Prior Publication Data

US 2016/0360638 A1 Dec. 8, 2016

(51) Int. Cl.
*H05K 7/18* (2006.01)
*A47B 96/06* (2006.01)
(Continued)

(52) U.S. Cl.
CPC ......... *A47B 96/061* (2013.01); *H05K 7/1488* (2013.01); *A47B 88/50* (2017.01)

(58) Field of Classification Search
CPC .......... A47B 88/50; A47B 88/57; H05K 7/18; H05K 7/183; H05K 7/186
See application file for complete search history.

(56) References Cited

U.S. PATENT DOCUMENTS 1,075,652 A * 10/1913 Kleber, Jr. ............. A47B 63/02
292/282
3,111,915 A * 11/1963 Gray ...................... A47B 57/04
108/106
(Continued)

FOREIGN PATENT DOCUMENTS

FR       2589308 A1 *  4/1987   ............... H05K 7/18
TW    200944159 A      11/2009
TW     M372116 U       1/2010

OTHER PUBLICATIONS

IBM, "Understanding and Installing the TS7620 Appliance Express Hardware," http://www-01.ibm.com/support/knowledgecenter/STQQ5B_3.2.0/com.ibm.storage.ts7610_3-2.cust.doc/ts7610isg_installing_the_hardware.htm, 26 pgs.
(Continued)

*Primary Examiner* — Stanton L Krycinski
(74) *Attorney, Agent, or Firm* — Scott S. Dobson

(57) ABSTRACT

A safety apparatus for an electrical equipment rack includes a retractable safety device for preventing, when in an operational position, the extending of an extendable rail and an electrical equipment unit mounted thereon from a position internal to the rack to a position external to the rack, and for allowing the same when in a non-operational position. The position of the retractable safety device is linked to the position of a retractable rack support such that when the retractable rack support is lowered in its operative position the retractable safety device is in a non-operational position, and when it is raised in a raised inoperative position the retractable safety device is in an operational position preventing the extending of the extendable rail and an electrical equipment unit mounted thereon to a position external to the rack.

18 Claims, 10 Drawing Sheets

(51) Int. Cl.
*H05K 7/14* (2006.01)
*A47B 88/50* (2017.01)

(56) References Cited

U.S. PATENT DOCUMENTS

| | | | | |
|---|---|---|---|---|
| 3,259,447 | A * | 7/1966 | Deutsch | A47B 88/57 312/334.46 |
| 3,981,511 | A * | 9/1976 | Foster | B62B 5/049 211/150 |
| 4,067,265 | A * | 1/1978 | Watson | A47F 5/12 108/7 |
| 4,095,861 | A * | 6/1978 | Kachidurian | A47B 97/00 211/153 |
| 4,466,676 | A * | 8/1984 | Nilsson | E05D 15/502 16/231 |
| 4,531,646 | A * | 7/1985 | Howard | A47F 5/12 108/6 |
| 4,627,542 | A * | 12/1986 | Fredrickson | A47F 5/12 211/150 |
| 5,372,262 | A * | 12/1994 | Benson | H05K 7/183 211/189 |
| 5,487,474 | A * | 1/1996 | Heimendinger | A47F 5/12 211/1.57 |
| 5,588,724 | A * | 12/1996 | Emery | A47B 77/02 312/216 |
| 5,902,025 | A * | 5/1999 | Yu | G06F 1/181 312/109 |
| 6,541,705 | B1 * | 4/2003 | McGrath | H05K 7/186 174/101 |
| 6,641,236 | B2 * | 11/2003 | Grudzien | A47B 88/944 296/37.6 |
| 7,156,475 | B2 * | 1/2007 | Gloger, Jr. | A47B 81/00 312/216 |
| 7,850,013 | B1 * | 12/2010 | Kramer | E05B 73/0082 211/26 |
| 8,235,475 | B2 | 8/2012 | Ludwig et al. | |
| 8,359,986 | B2 * | 1/2013 | Sekiguchi | E05G 1/06 109/53 |
| 8,464,878 | B2 * | 6/2013 | Andersen | A47F 1/12 211/150 |
| 8,544,860 | B2 | 10/2013 | Fan | |
| 8,567,883 | B2 | 10/2013 | Hsiao | |
| 8,746,470 | B2 * | 6/2014 | Reinbigler | A47B 57/04 211/126.15 |
| 2003/0233855 | A1 * | 12/2003 | Pirveysian | E05B 65/467 70/62 |
| 2006/0243690 | A1 | 11/2006 | Mollard | |
| 2009/0266775 | A1 * | 10/2009 | Vanderhoek | A47B 46/00 211/49.1 |
| 2011/0049074 | A1 * | 3/2011 | Woolard | B65G 1/02 211/191 |
| 2011/0068943 | A1 * | 3/2011 | Lane, Jr. | B65G 1/02 340/668 |
| 2011/0115354 | A1 | 5/2011 | Blochl et al. | |
| 2012/0062084 | A1 | 3/2012 | Lewis, II et al. | |
| 2015/0076976 | A1 | 3/2015 | Bailey et al. | |

OTHER PUBLICATIONS

Notohardjono, B. et al, "Static and Dynamic Handling Stability of Server Rack Computers," http://proceedings.asmedigitalcollection.asme.org/proceeding.aspx?articleid=1920122, ASME 2014 12th Biennial Conference on Engineering Systems Design and Analysis, vol. 3: Engineering Systems; Heat Transfer and Thermal Engineering; Materials and Tribology; Mechatronics; Robotics, Copenhagen, Denmark, Jul. 25-27, 2014 Conference Sponsors: International, ISBN: 978-0-7918-4585-1, © 2014 by ASME, Abstract only, 4 pgs.

* cited by examiner

Prior Art

SAFETY APPARATUS FOR ELECTRICAL EQUIPMENT RACK

BACKGROUND

The present disclosure relates to electrical equipment racks, and more specifically, to safety mechanisms for electrical equipment racks.

Most datacenters are based around standard racking systems, each rack containing a number of individually removable electrical equipment units, particularly data handling units, for example data storage units or server computer units. In one common configuration, a standard rack comprises a large skeletal metal frame defining a rectangular faced box comprising a horizontal rectangular base with an upright mounting member extending from each corner, and with a top completing the structure. The rack is designed for the horizontal insertion of a number of data handling units, for example server computer units, or servers, typically each server being of a standard size. Standard server-rack configurations are measured in server units, each server unit or 1 U comprising a horizontal space measuring 19 inches (480 mm) wide by 1.75 inches (44 mm) high. A typical full size rack accommodates a 42 U high collection of standard sized servers, for example up to 21 2 U servers, and typically measure 73.5 inches (1.87 m) high internally. Other sizes include 36 U and 47 U racks.

Typically each server is mounted on an extendable horizontal mounting rail arrangement at either side of the rack. Each mounting rail comprises a horizontal fixed element which clips in to the front and back vertical members on one side of the rack, using one or more of provided spaced mounting holes in each vertical member. Each mounting rail further comprises a horizontal server support member extendable on roller bearings out of the front of the rack. When the server support members of two complementary mounting rails on either side of the rack are extended out of the front of the rack, a horizontally aligned server may be attached to each side server support member by way of, for example, complementary protruding and recessed fastening means. Once securely attached to each side server support member, the server may be pushed fully in to the rack by way of the roller bearings in the mounting rails. Once in its operational position, service cabling may be attached to the mounted server.

Typically server racks are designed to be moveable by means of casters arranged adjacent each corner of the rack base. It is clearly desirable to be able to secure the server rack once it is in a desired location. To facilitate this, a support leg is also provided adjacent each corner. The support legs are retractable into the rack volume and are raised to a retracted position when the rack is moved on its casters, but are lowered once the rack is in a desired location so that the rack is supported on the legs and the casters are raised above the floor or otherwise immobilized by a locking mechanism.

SUMMARY

Embodiments of the present disclosure provide a safety apparatus for an electrical equipment rack, and an electrical equipment rack comprising the safety apparatus. The safety apparatus comprises a retractable safety device for preventing, when in an operational position, the extending of at least one of the extendable rails and an electrical equipment unit mounted thereon from a position internal to the rack to a position external to the rack, and for allowing the same when in a non-operational position. The position of the retractable safety device is linked to the position of at least one of the retractable rack supports so that when the retractable rack support is lowered to its operative position to support the rack, the retractable safety device is in a non-operational position, and when the retractable rack support is raised to a raised inoperative position the retractable safety device is in an operational position preventing the extending of the at least one of the extendable rails and an electrical equipment unit mounted thereon to a position external to the rack.

The above summary is not intended to describe each illustrated embodiment or every implementation of the present disclosure.

BRIEF DESCRIPTION OF THE DRAWINGS

Embodiments of the present disclosure will now be described, by way of example only, with reference to the following drawings in which.

Figure 1:
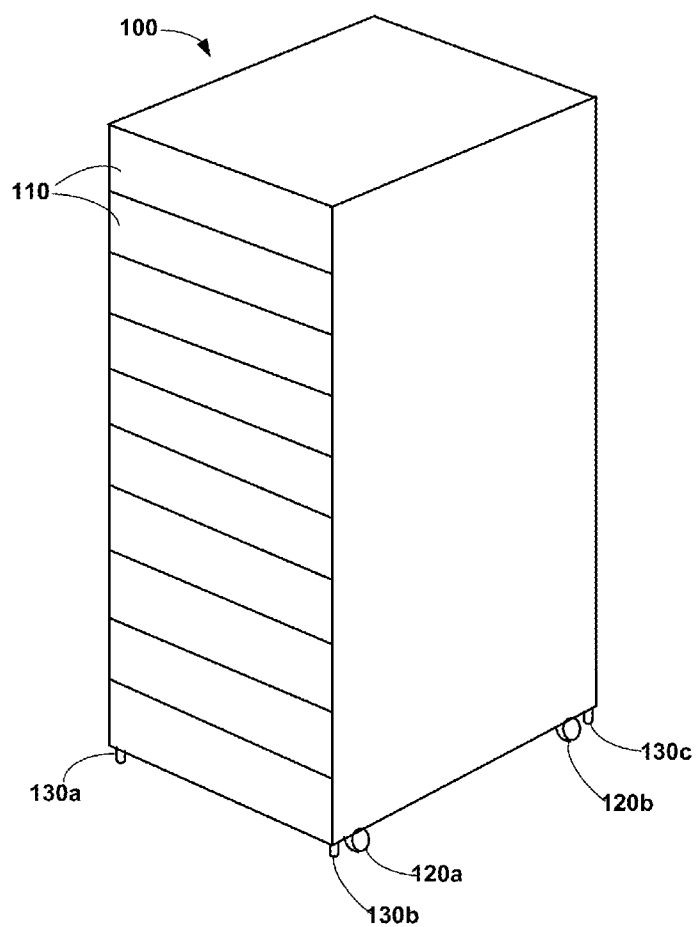
FIG. 1 illustrates an electrical equipment rack according to the prior art.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

A standard rack 100 according to the prior art is illustrated in FIG. 1. Rack 100 comprises a frame containing a number of servers 110 mounted in the rack. Rack 100 comprises casters 120a, 120b attached to the underside of the base member of frame of rack 100, typically one caster adjacent each corner of the base member of the frame of rack 100.

Rack 100 is moveable over a surface, such as the floor of the datacenter in which it is to be installed, by means of casters 120a, 120b. In addition, rack 100 comprises supports for supporting the rack on the floor, for example support legs 130a, 130b, 130c, typically one support leg adjacent each corner of the base member of the frame of rack 100. These are raised when the rack 100 is moved on its casters 120a, 120b, and lowered so that the rack is supported on them when the rack 100 is installed in an operational site within the datacenter.

Figure 2:
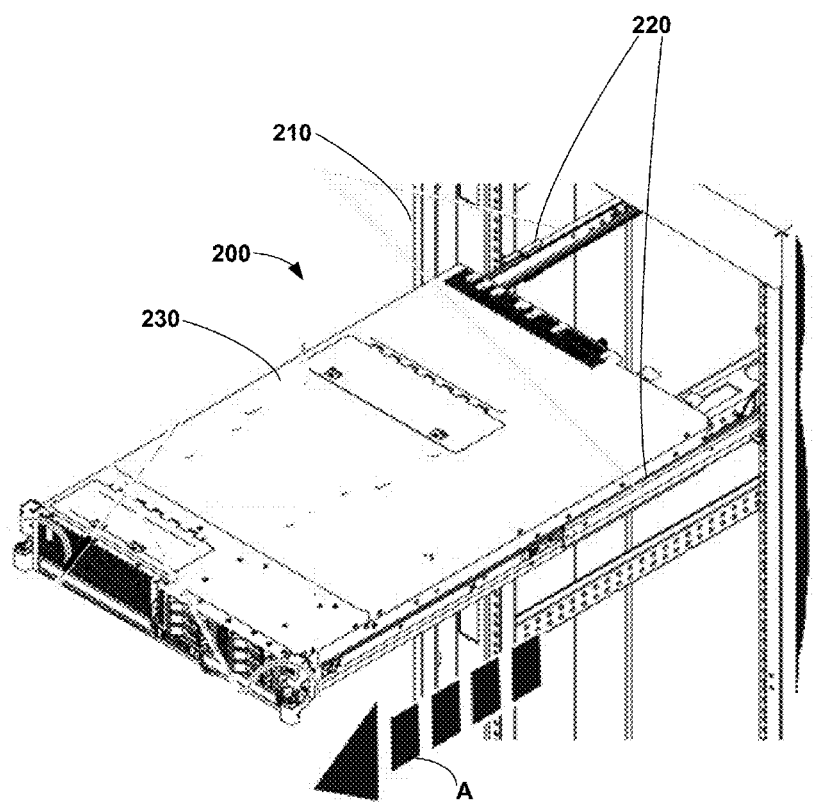
FIG. 2 illustrates operation of an electrical equipment unit rack drawer according to the prior art.

FIG. 2 illustrates a server rack mounting arrangement 200 according to the prior art. Rack frame 210 comprises mounting points for extendable server mounting rails 220 on to which are mounted server 230. Server 230 may be moved between an operational position within rack frame 210 and a position external to the rack frame 210, as illustrated by the arrow A shown in FIG. 2, by means of the extendable server mounting rails 220. At the external position, server 230 may be removed by lifting from extendable server mounting rails 220.

Figure 3:
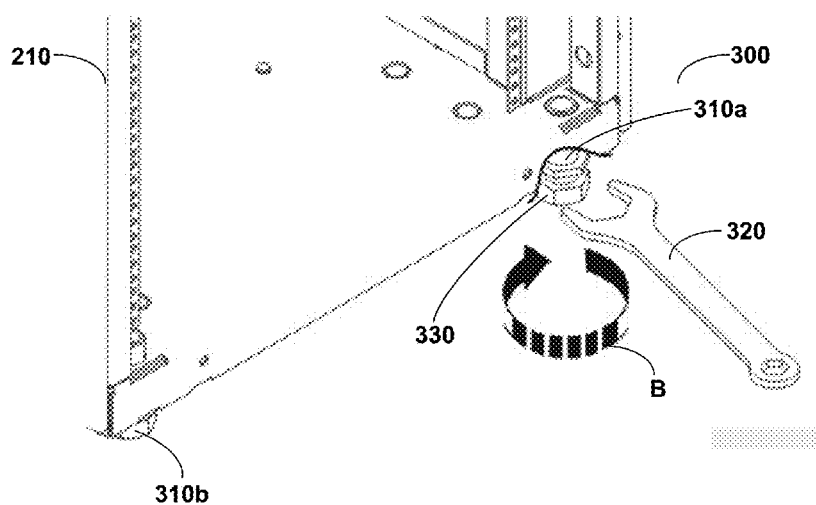
FIG. 3 illustrates operation of an electrical equipment unit retractable support according to the prior art.

FIG. 3 illustrates a retractable support leg extending operation 300 according to the prior art. Illustrated is a perspective view of the lower part of the front side of rack frame 210 comprising support legs 310a, 310b adjacent respectively the right hand and left hand front lower corners of the rack frame 210. Each of support legs 310a, 310b is inserted into rack frame 210 by a screw thread into a screw threaded orifice of the base of rack frame 210. Illustrated is the extension operation of support leg 310a from its refracted, raised position in rack frame 210. Wrench 320 is used to rotate bolt 330 at lower end of support leg 310a in the clockwise direction of arrow B so as to unscrew support leg 310a until it contacts the floor. Further, turning in direction of arrow B will serve to raise the front right corner of rack frame 210 so that it is supported on support leg 310a and the caster at the front right corner is raised clear of the floor so that this corner of rack frame 210 is prevented from movement over the floor on its caster. The operation is repeated for each of the other support legs to secure the rack against movement on its casters.

If a rack loaded with servers is moved on its casters, one or more individual servers may move out of the rack on their mounting rails during the moving operation. This may lead to the rack becoming unstable and at worst falling over. Embodiments of the present disclosure may provide for a safety apparatus which prevents movement of servers out of a rack during a moving operation.

Figure 4A:
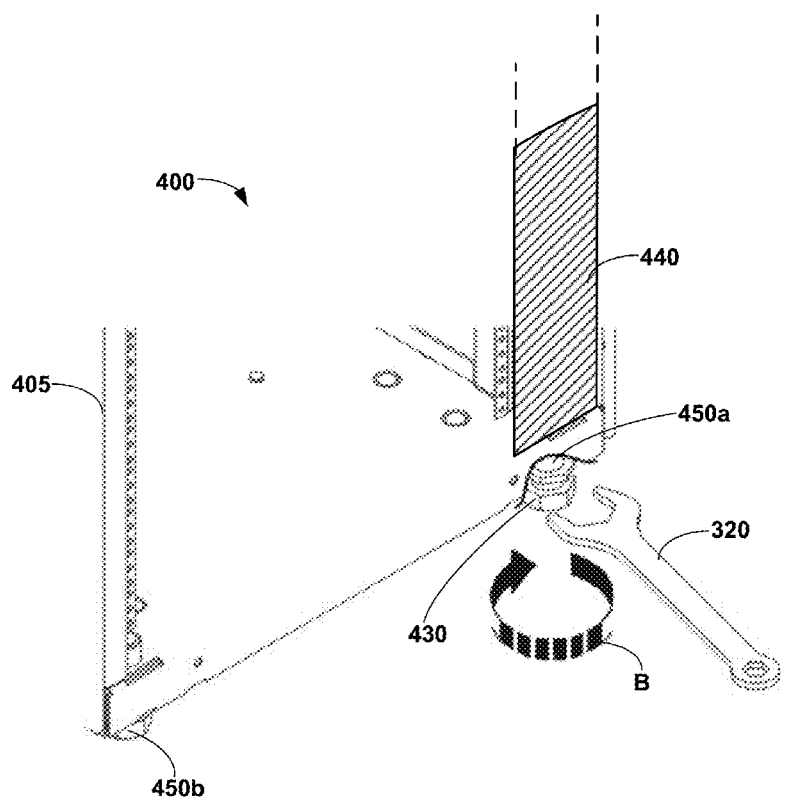
FIG. 4A illustrates the lower portion of the front of a rack with a retractable rack safety device in an operational position according to an embodiment of the disclosure.
Figure 5:
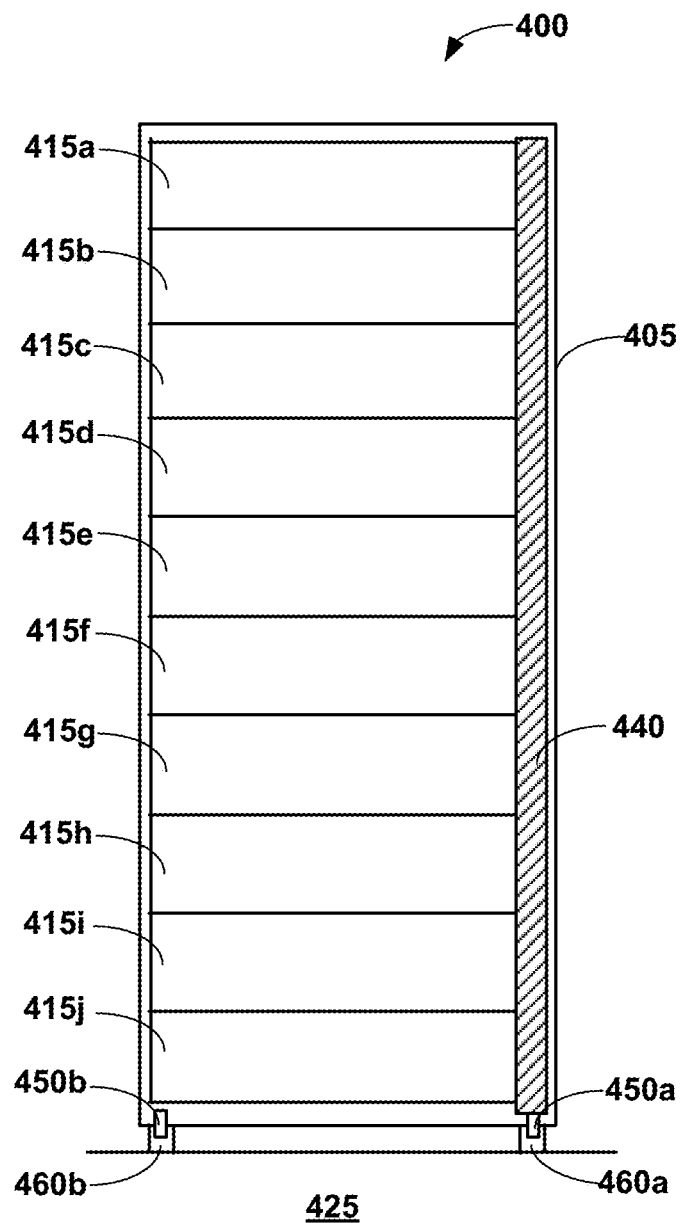
FIG. 5 illustrates a plan view of the front of a rack with a retractable rack safety device in an operational position according to an embodiment of the disclosure.

FIG. 4A illustrates an embodiment of the present disclosure comprising rack 400 showing the lower part of the front of rack frame 405 of rack 400. FIG. 5 illustrates a plan view of the whole of the front of rack 400 of this embodiment. Rack 400 comprises electrical equipment units, such as servers, mounted on rails attached to rack frame 405 as described previously with reference to the prior art and illustrated in FIGS. 1 to 3. Servers 415a-415j are illustrated but a person skilled in the art will understand that a larger or smaller number of servers may be mounted in rack 400 without departing from the scope of the invention.

The front of rack frame 405 of rack 400 in FIGS. 4A and 5 comprises retractable safety device 440 in an operational position. In the embodiment illustrated in FIGS. 4A and 5 retractable safety device 440 comprises a plate, for example a metal plate, elongated in the vertical direction of rack frame 405. FIG. 5 shows the full extent of retractable safety device 440 which extends substantially the whole height of rack frame 405. Retractable safety device 440 is configured, when in an operational position, so as to prevent movement of servers 415a-415j out of the rack on their rails as illustrated according to the prior art by arrow A in FIG. 2. In the embodiment illustrated in FIGS. 4A and 5, retractable safety device 440 comprising a plate accomplishes this by providing a physical barrier against which at least a portion of servers 415a-415j abuts when movement in direction of arrow A out of rack 400 commences, for example in response to movement of rack 400 on its casters, and is arrested by the physical barrier of retractable safety device 440 so as to prevent further movement in direction of arrow A.

When retractable safety device 440 is in an operational position as illustrated in FIGS. 4A and 5, support leg 450a is in its retracted position within rack frame 405 of rack 400 raised above floor 425, for example a datacenter floor, so that rack 400 is supported on caster 460a. When all support legs, including front left support leg 450b and rear support legs (not shown), are raised, rack 400 is supported on, and moveable over floor 425 on, its casters, front casters 460a and 460b illustrated.

Figure 6:
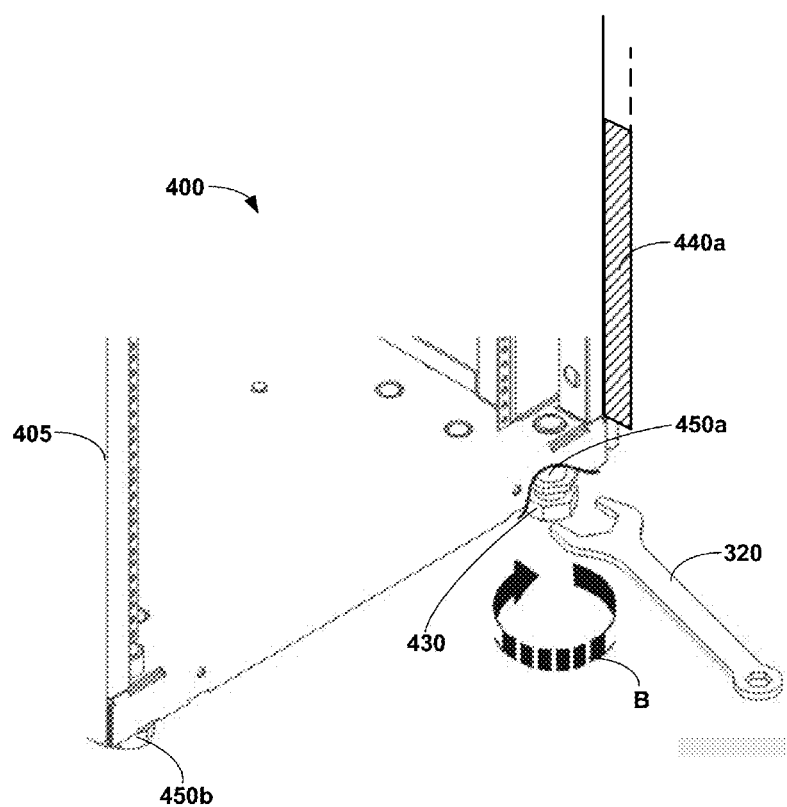
FIG. 6 illustrates the lower portion of the front of a rack with a retractable rack safety device in a non-operational position according to an embodiment of the disclosure.
Figure 7:
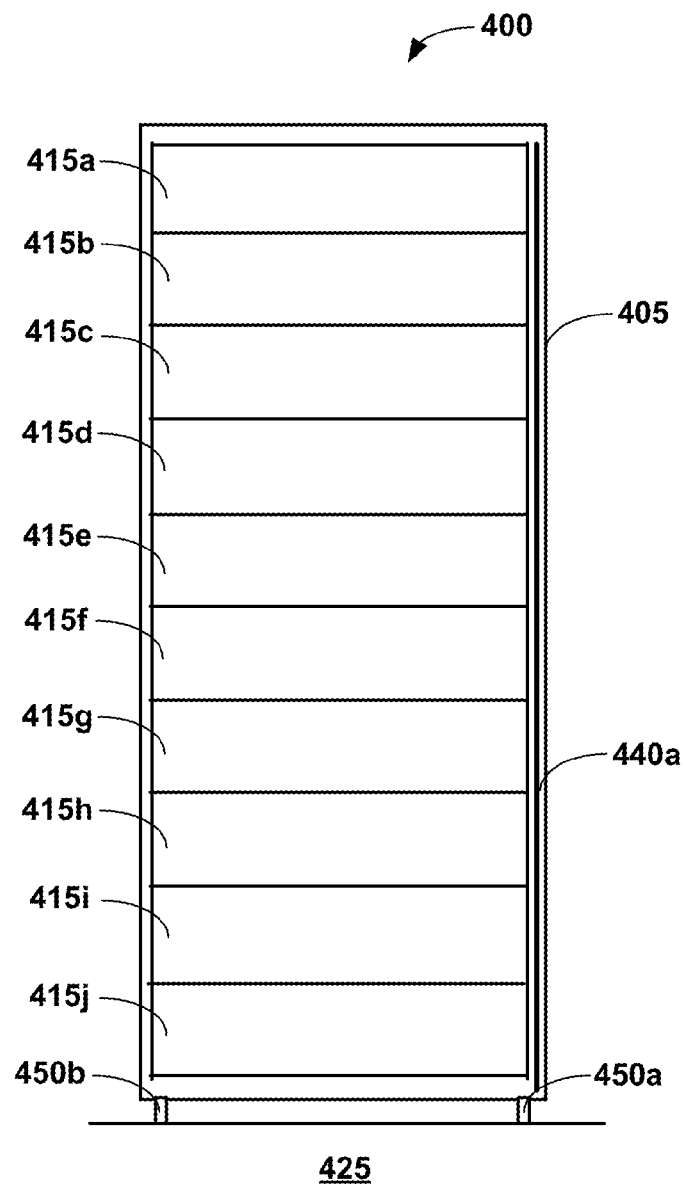
FIG. 7 illustrates a plan view of the front of a rack with a retractable rack safety device in a non-operational position according to an embodiment of the disclosure.

In an embodiment, retractable safety device 440 is operable for moving between an operational position as illustrated in FIGS. 4A and 5 and a non-operational, retracted position as illustrated in FIGS. 6 and 7 which show views from the same positions as respectively FIGS. 4A and 5. In an embodiment retractable safety device 440 is operable for moving through a path approximating to an arc of movement from the operational position as illustrated in FIGS. 4A and 5 to a non-operational position as shown by 440a of FIGS. 6 and 7. In the non-operational position 440a, retractable safety device 440 comprising a plate is oriented at an angle of approximately 90 degrees to the operational position as illustrated in FIGS. 4A and 5. FIG. 7 illustrates an embodiment in which position 440a comprises a location adjacent the side of rack frame 405. It will be apparent to the skilled person that other arrangements and locations of a non-operational position may be envisaged without departing from the scope of the invention. When retractable safety device 440 is in non-operational position 440a, it no longer presents a physical barrier to the movement of servers 415a-415j on their mounting rails and each may be moved to its full extent out of rack 400.

Figure 4B:
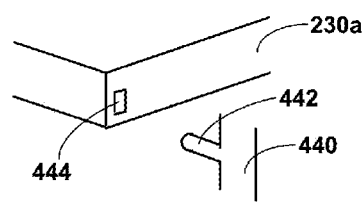
FIG. 4B illustrates an embodiment comprising an alternative arrangement of a retractable rack safety device.

In other embodiments, the retractable safety device may comprise a structure different from the plate as discussed above with reference to the figures. In some embodiments, the retractable safety device may comprise an individual barrier for each server. In other embodiments other means of interacting with individual servers may be envisaged, for example a protruding element of the retractable safety device which interacts with a server in a different way than providing a physical barrier in front of the server. In one embodiment illustrated in FIG. 4B this is by way of a protruding element 442 of retractable safety device 440 for engaging a matched recess 444 in server 230a.

In other embodiments, the retractable safety device may act upon only some of the servers in the rack, for example only those servers above a certain height in the rack. It will be apparent to persons skilled in the art that other variations and modifications may be envisaged without departing from the scope of the invention.

In an embodiment, movement of retractable safety device 440 is linked to movement of support leg 450a relative to rack frame 405 of rack 400. In an embodiment there is a mechanical link between the position of support leg 450a and retractable safety device 440. As illustrated in FIGS. 4A and 5, support leg 450a is in a raised position, for example screwed in to a screw-threaded orifice in rack frame 405, and retractable safety device 440 is in an operational position. Support leg 450a is lowered, for example by unscrewing it by engaging bolt 430 at the lower end of support leg 450a with wrench 320 and turning in direction of arrow B of FIG. 4A, until support leg 450a is resting on floor 425. Further turning will raise rack 400 so that caster 460a is clear of floor 425. At this position of support leg 450a the mechanical link causes retractable safety device 440 to move to position 440a.

Figure 8A:
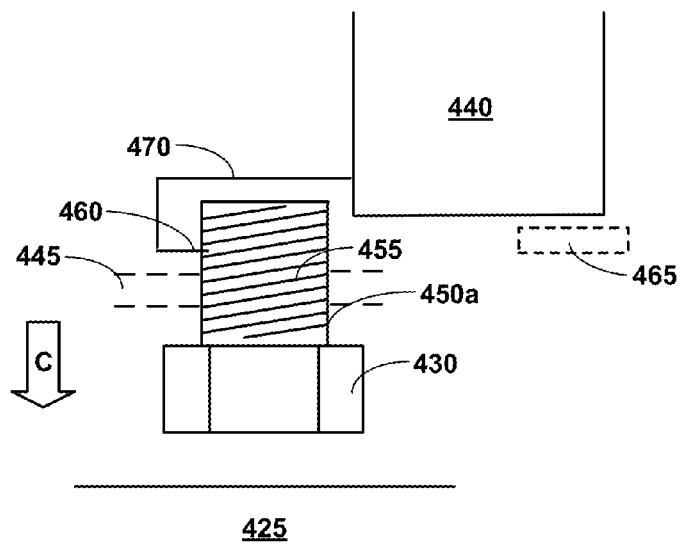
FIG. 8A illustrates a linkage of a retractable rack support in a non-operative position to a retractable rack safety device in an operational position.
Figure 8B:
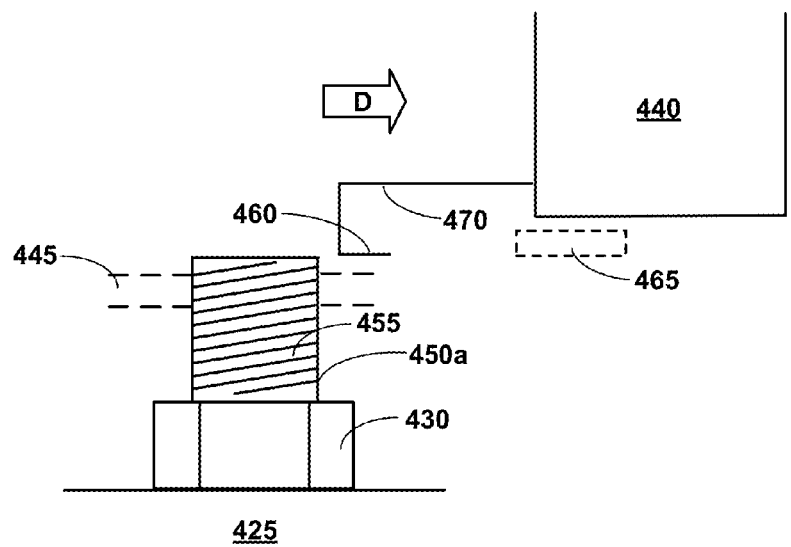
FIG. 8B illustrates a linkage of a retractable rack support in an operative position to a retractable rack safety device in a non-operational position.

FIGS. 8A and 8B illustrate an embodiment comprising a mechanical link between support leg 450a and retractable safety device 440. FIG. 8A illustrates the embodiment with retractable safety device 440 in an operational position. Support leg 450a comprises a threaded portion 455 and a bolt portion 430 adjacent the lower end of support leg 450a. Threaded portion 455 is located in a threaded orifice in base 445 of rack frame 405. Thread engaging element, such as peg 460 or similar, engages the groove of threaded portion 455 and is linked by mechanical linkage 470 to retractable safety device 440. Bolt portion 430 is engaged by wrench 320 and rotated in direction B as shown in FIG. 4A. In response support leg 450a moves in the direction of arrow C.

In the depicted embodiment, retractable safety device 440 is acted upon by a biasing device 465. Biasing device 465 includes, for example, a mechanism including a spring under tension. Biasing device 465 provides biasing so as to move retractable safety device in direction of arrow D and maintain engagement of peg 460 with threaded portion 455 of support leg 450a. Support leg 450a reaches floor 425 as shown in FIG. 8B. Peg 460 of linkage 470 now ceases to engage threaded portion 455 of support leg 450a and biasing device 465 causes linked retractable safety device 440 to move in direction of arrow D to a non-operational position, for example position 440a of FIGS. 6 and 7.

Figure 9:
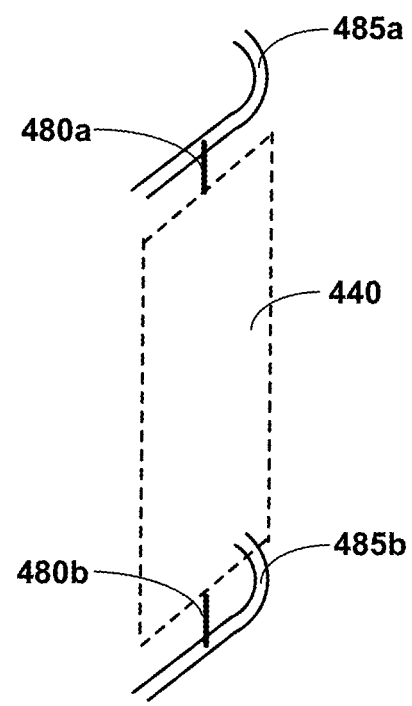
FIG. 9 illustrates a guiding support of a retractable rack safety device.

Retractable safety device 440 path may be guided, for example by a guiding support. FIG. 9 illustrates an embodiment with guiding support including projections 480a and 480b at top and bottom edges respectively of retractable safety device 440 running in guiding channels 485a, 485b at respectively top and bottom of retractable safety device 440.

Figure 10:
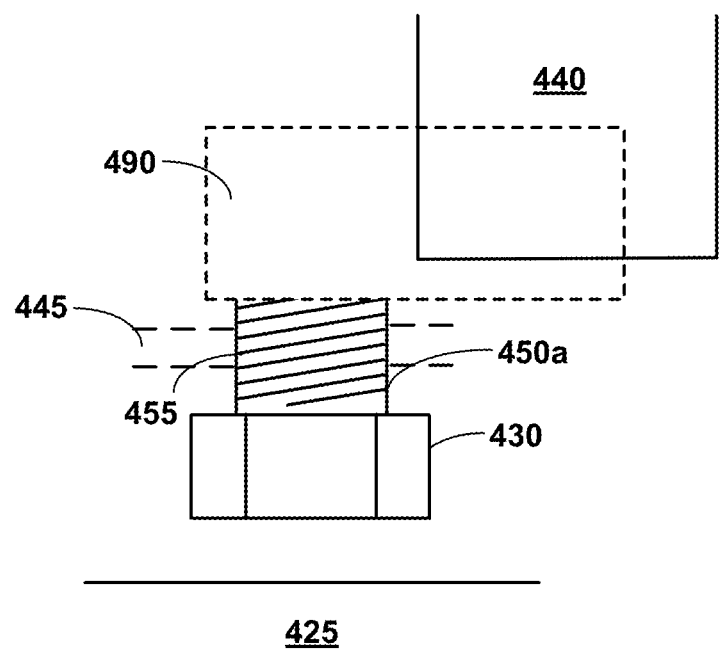
FIG. 10 illustrates an embodiment comprising a linkage mechanism producing continuing movement of a retractable rack safety device.

In other embodiments, the mechanical link may comprise a structure different from that discussed with reference to FIGS. 8a and 8b. In some embodiments, support leg 450a is linked to retractable safety device 440 by way of a permanent linkage. In one embodiment illustrated in FIG. 10 the mechanical link comprises a permanent linkage comprising a geared linkage mechanism 490 without the use of a biasing device. In this embodiment, unscrewing of support leg 450a produces a continual movement of retractable safety device 440 from an operational to a non-operational position as support leg 450a is rotated, for example by wrench 320. It will be apparent to a person skilled in the art that other arrangements of linkage between a support leg and a retractable safety device may be envisaged without departing from the scope of the invention.

It will be apparent to a person skilled in the art that although embodiments of the disclosure have been described with reference to the front right support leg 450a for convenience of description, embodiments of the disclosure may equally be applied to other support legs of the rack, for example the front left support leg 450b, either as an alternative or in addition to the embodiments described above. In other embodiments a single retractable safety device is linked to more than one retractable support leg, and moves to a non-operational position only when all linked support legs are in an operative position to support the rack. It will also be apparent that other variations than those described above may be envisaged without departing from the scope of the invention.

Although the embodiments described herein have described mounting of servers within racks, any suitable electrical equipment unit could be mounted to the racks. For example, an electrical equipment unit mounted in a rack could include one or more of a data handling unit, a server computer unit, a telecommunications units, or a data storage unit.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A safety apparatus for an electrical equipment rack, the rack comprising a frame comprising mounting arrangements for extendable rails for mounting electrical equipment units, the extendable rails allowing the electrical equipment units to be extended on the extendable rails from a position internal to the rack to a position external to the rack, and the rack further comprising casters for supporting a base of the rack during movement of the rack over a surface, and retractable rack supports which when extended from raised inoperative positions to lowered operative positions support the rack on the surface, the safety apparatus comprising:
a retractable safety device for preventing, when in an operational position, the extending of one of said extendable rails and one of said electrical equipment units mounted on the extendable rail from a position internal to the rack to a position external to the rack, and for allowing the extending of the extendable rail and the electrical equipment unit mounted on the extendable rail when in a non-operational position, the position of the retractable safety device being linked to the position of one of said retractable rack supports such that:
when the retractable rack support is lowered in the lowered operative position to support the rack, the retractable safety device is in the non-operational position; and
when the retractable rack support is raised in the raised inoperative position the retractable safety device is in the operational position preventing the extending of the extendable rail and the electrical equipment unit mounted on the extendable rail to a position external to the rack.

2. The apparatus of claim 1, wherein the retractable safety device is mechanically linked to the retractable rack support such that movement of the retractable rack support relative to the rack produces a movement of the retractable safety device.

3. The apparatus of claim 2, wherein the mechanical link comprises a thread engaging element engaging a thread of the retractable rack support when the retractable rack support is in the raised inoperative position, and ceasing to engage the thread when the support is in the lowered operative position, and further comprising a biasing device for moving the retractable safety device to the non-operational position when the thread engaging element is no longer engaged with the thread.

4. The apparatus of claim 2, wherein the mechanical link comprises a linkage mechanism producing continuing movement of the retractable safety device between the operational position when the retractable rack support is in the raised inoperative position and the non-operational position when the support is in the lowered operative position.

5. The apparatus of claim 1, wherein the retractable safety device comprises a physical barrier to extending of the electrical equipment unit on the extendable rail when in the operational position.

6. The apparatus of claim 5, wherein the physical barrier comprises a plate.

7. The apparatus of claim 6, wherein the plate is operable for guided movement by a guiding support at a top and bottom of the plate.

8. The apparatus of claim 1, wherein the retractable safety device comprises an element protruding in to a recess in the electrical equipment unit when in the operational position.

9. The apparatus of claim 1, wherein the electrical equipment unit comprises one or more of a data handling unit, a server computer unit, a telecommunications unit, or a data storage unit.

10. An electrical equipment rack comprising:
a frame comprising mounting arrangements for extendable rails for mounting electrical equipment units, the extendable rails allowing the electrical equipment units to be extended on the extendable rails from a position internal to the rack to a position external to the rack;
casters for supporting a base of the rack during movement of the rack over a surface;
retractable rack supports which when extended from raised inoperative positions to lowered operative positions support the rack on the surface; and
a safety apparatus, the safety apparatus comprising:
a retractable safety device for preventing, when in an operational position, the extending of one of said extendable rails and one of said electrical equipment units mounted on the extendable rail from a position internal to the rack to a position external to the rack, and for allowing the extending of the extendable rail and the electrical equipment unit mounted on the extendable rail when in a non-operational position, the position of the retractable safety device being linked to the position of one of said retractable rack supports such that:

when the retractable rack support is lowered in the lowered operative position to support the rack, the retractable safety device is in the non-operational position; and
when the retractable rack support is raised in the raised inoperative position the retractable safety device is in the operational position preventing the extending of the extendable rail and the electrical equipment unit mounted on the extendable rail to a position external to the rack.

11. The electrical equipment rack of claim 10, wherein the retractable safety device is mechanically linked to the retractable rack support so that movement of the retractable rack support relative to the rack produces a movement of the retractable safety device.

12. The electrical equipment rack of claim 11, wherein the mechanical link comprises a thread engaging element engaging a thread of the retractable rack support when the retractable rack support is in the raised inoperative position, and ceasing to engage the thread when the support is in the lowered operative position, and further comprising a biasing device for moving the retractable safety device to the non-operational position when the thread engaging element is no longer engaged with the thread.

13. The electrical equipment rack of claim 11, wherein the mechanical link comprises a linkage mechanism producing continuing movement of the retractable safety device between the operational position when the retractable rack support is in the raised inoperative position and a non-operational position when the support is in the lowered operative position.

14. The electrical equipment rack of claim 10, wherein the retractable safety device comprises a physical barrier to extending of the electrical equipment unit on the extendable rail when in the operational position.

15. The electrical equipment rack of claim 14, wherein the retractable safety device comprises a plate.

16. The electrical equipment rack of claim 15, wherein the plate is operable for guided movement by a guiding support at a top and bottom of the plate.

17. The electrical equipment rack of claim 10, wherein the retractable safety device comprises an element protruding in to a recess in the electrical equipment unit when in the operational position.

18. The electrical equipment rack of claim 10, wherein the electrical equipment unit comprises one or more of a data handling unit, a server computer unit, a telecommunications unit, or a data storage unit.

* * * * *